(12) United States Patent
Soeno et al.

(10) Patent No.: US 9,865,728 B2
(45) Date of Patent: Jan. 9, 2018

(54) SWITCHING DEVICE (71) Applicant: TOYOTA JIDOSHA KABUSHIKI KAISHA, Toyota-shi, Aichi-ken (JP)

(72) Inventors: Akitaka Soeno, Toyota (JP); Masaru Senoo, Okazaki (JP); Takashi Kuno, Kariya (JP); Satoshi Kuwano, Nagakute (JP); Noriyuki Kakimoto, Kariya (JP); Toshitaka Kanemaru, Kariya (JP); Kenta Hashimoto, Kariya (JP); Yuma Kagata, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/425,286

(22) Filed: Feb. 6, 2017

(65) Prior Publication Data

US 2017/0263754 A1 Sep. 14, 2017

(30) Foreign Application Priority Data

Mar. 9, 2016 (JP) ................................ 2016-046094

(51) Int. Cl.
*H01L 29/06* (2006.01)
*H01L 29/778* (2006.01)
(Continued)

(52) U.S. Cl.
CPC ...... *H01L 29/7813* (2013.01); *H01L 29/0619* (2013.01); *H01L 29/0696* (2013.01);
(Continued)

(58) Field of Classification Search
CPC .................... H01L 29/0619; H01L 29/7813
See application file for complete search history.

(56) References Cited

U.S. PATENT DOCUMENTS 5,757,046 A * 5/1998 Fujihira .............. H01L 29/0619
257/139
6,667,515 B2 * 12/2003 Inoue ................. H01L 29/0619
257/339
(Continued)

FOREIGN PATENT DOCUMENTS

JP 2005-116963 A 4/2005
JP 2015-225872 A 12/2015
JP 2017-028069 A 2/2017

*Primary Examiner* — Jarrett Stark
*Assistant Examiner* — Charles N Ausar-El
(74) *Attorney, Agent, or Firm* — Oliff PLC (57) ABSTRACT

A switching device including a semiconductor substrate including a trench (gate electrode) extending in a mesh shape is provided, and the upper surface of the semiconductor substrate is covered by the interlayer insulating film. Within an element range a contact hole is provided in an interlayer insulating film above each cell region while within a surrounding range an entire upper surface of each cell region is covered by the interlayer insulating film. The first metal layer covers the interlayer insulating film, and has recesses above the contact holes. The insulating protective film covers an outer peripheral side portion of the first metal layer within the surrounding range. The second metal layer covers the first metal layer within an opening of the insulating protective film. Within the surrounding range, a second conductivity-type region extending to below lower ends of the trench and is electrically connected to the body region, is provided.

4 Claims, 7 Drawing Sheets (51) Int. Cl.
  *H01L 29/78*   (2006.01)
  *H01L 29/423*  (2006.01)
  *H01L 29/10*   (2006.01)
  *H01L 29/08*   (2006.01)
  *H01L 29/739*  (2006.01)

(52) U.S. Cl.
  CPC ...... *H01L 29/0865* (2013.01); *H01L 29/0882* (2013.01); *H01L 29/1095* (2013.01); *H01L 29/4236* (2013.01); *H01L 29/7397* (2013.01); *H01L 29/7811* (2013.01)

(56) References Cited

U.S. PATENT DOCUMENTS

| | | | | |
|---|---|---|---|---|
| 7,598,566 B2* | 10/2009 | Hotta | ................ | H01L 29/0696 257/327 |
| 8,330,185 B2* | 12/2012 | Soeno | ................ | H01L 27/0664 257/133 |
| 8,736,029 B2* | 5/2014 | Sato | ................ | H01L 29/404 257/632 |
| 9,748,370 B2* | 8/2017 | Kumada | ............ | H01L 29/7397 |
| 2005/0077617 A1 | 4/2005 | Hirano et al. | | |
| 2007/0126086 A1* | 6/2007 | Kanata | ................ | H01L 23/291 257/626 |
| 2011/0201187 A1* | 8/2011 | Nishiwaki | ........... | H01L 29/0834 438/529 |
| 2011/0207321 A1* | 8/2011 | Fujiwara | ............ | H01L 21/324 438/663 |
| 2011/0297934 A1* | 12/2011 | Soeno | ................ | H01L 29/7397 257/48 |
| 2012/0326207 A1* | 12/2012 | Yoshimochi | .......... | H01L 29/866 257/139 |
| 2013/0105889 A1* | 5/2013 | Fujiwara | ........... | H01L 29/66068 257/330 |
| 2014/0061871 A1* | 3/2014 | Nagasawa | ............ | H01L 23/562 257/635 |
| 2014/0203356 A1* | 7/2014 | Kagata | ................ | H01L 29/407 257/330 |
| 2014/0213019 A1* | 7/2014 | Onishi | ................ | H01L 29/7397 438/118 |
| 2014/0231866 A1* | 8/2014 | Senoo | .................... | H01L 29/36 257/139 |
| 2014/0374871 A1* | 12/2014 | Hirabayashi | .......... | H01L 29/404 257/488 |
| 2015/0171199 A1* | 6/2015 | Senoo | ................ | H01L 29/7397 257/140 |
| 2015/0279953 A1* | 10/2015 | MacHida | ............ | H01L 29/456 257/330 |
| 2016/0141401 A1* | 5/2016 | Hirabayashi | ........ | H01L 29/7397 257/139 |
| 2017/0011952 A1* | 1/2017 | Saito | ................ | H01L 29/7811 |
| 2017/0025521 A1 | 1/2017 | Nakagawa et al. | | |
| 2017/0243964 A1* | 8/2017 | Sato | .................... | H01L 29/7397 |

* cited by examiner

SWITCHING DEVICE

TECHNICAL FIELD

The present disclosure relates to a switching device.

BACKGROUND ART

Japanese Patent Application Publication No. 2005-116963 discloses a switching device having a semiconductor substrate, an upper surface of which is connected to a heat sink block by soldering.

Further, Japanese Patent Application Publication No. 2015-225872 discloses a switching device having a trench that extends in a mesh shape in an upper surface of a semiconductor substrate. An inner surface of the trench is covered with a gate insulating film. A gate electrode is disposed inside the trench. An interlayer insulating film covers the upper surface of the semiconductor substrate and the gate electrode. A contact hole is provided in the interlayer insulating film above each of portions surrounded by the trench (hereinafter referred to as cell regions) in the semiconductor substrate. An upper electrode covers the interlayer insulating film, and is in contact with the semiconductor substrate in the contact holes. Each cell region includes a first region (emitter region) of a first conductivity type (n-type), and a body region of a second conductivity type (p-type). Each of the first regions is in contact with the upper electrode and the gate insulating film. The body region is in contact with the upper electrode, and is in contact with the gate insulating film below the first regions. Further, the semiconductor substrate includes a second region (drift region) of the first conductivity type. The second region is in contact with the gate insulating film below the body region, and is separated from the first regions by the body region. In this switching device, when a potential of the gate electrode is controlled to a predetermined potential, channels are formed in the body region. The first regions and the second region are electrically connected by the channels. Accordingly, a current flows between the first regions and the second region.

SUMMARY

An upper electrode of such a switching device as disclosed in Japanese Patent Application Publication No. 2005-116963, usually includes a first metal layer and a second metal layer. The first metal layer is a metal layer being in contact with the upper surface of the semiconductor substrate. The first metal layer is constituted of a material that is less likely to contaminate the semiconductor substrate and makes contact with the semiconductor substrate at a low contact resistance. The second metal layer is a metal layer disposed on the first metal layer and makes contact with soldering. The second metal layer is constituted of a material that is easy to be connected to the soldering.

Figure 6:
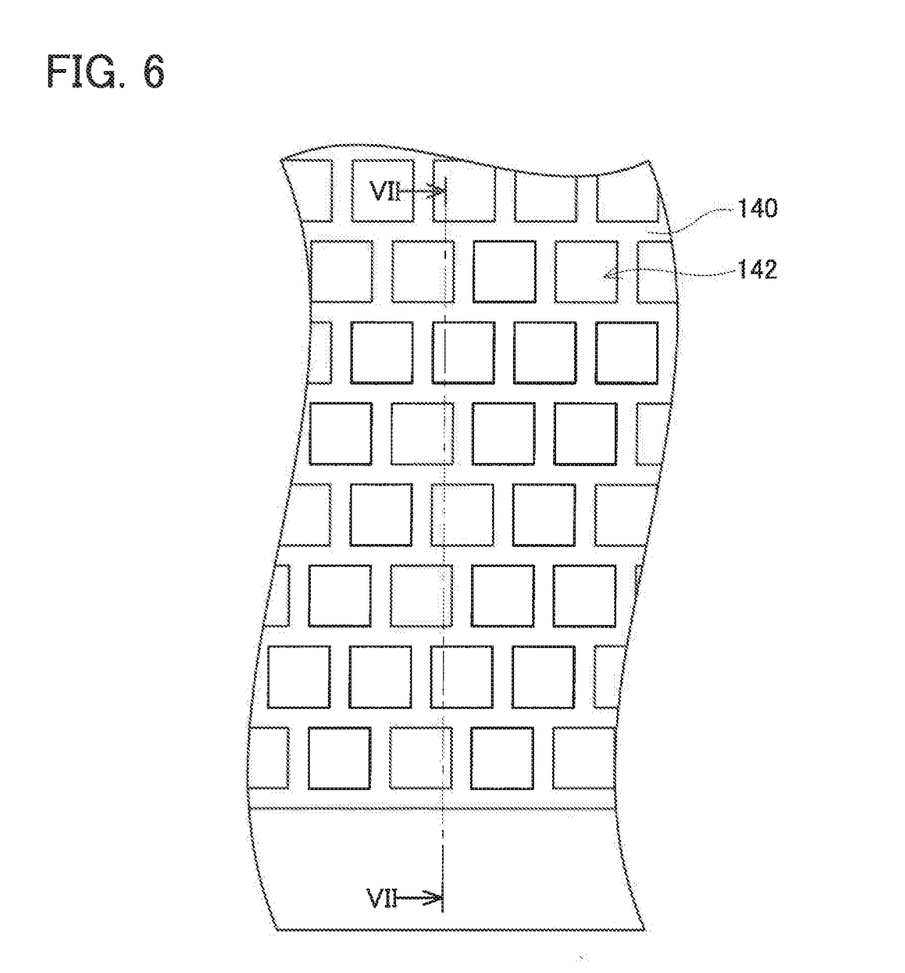
FIG. 6 is a plan view of a switching device of comparative example 1.
Figure 7:
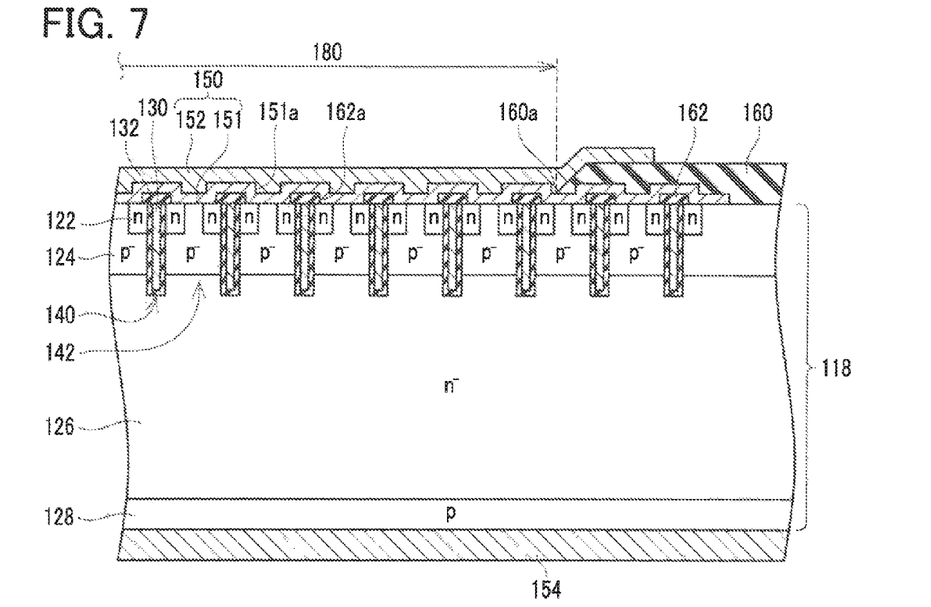
FIG. 7 is a vertical cross sectional view of the switching device of comparative example 1 (vertical cross sectional view taken along line VII-VII of FIG. 6).

In a switching device that includes a trench extending in a mesh shape as disclosed in Japanese Patent Application Publication No. 2015-225872, an upper electrode may be sometimes constituted of a first metal layer and a second metal layer to connect the upper electrode to an exterior by soldering. For example, FIG. 7 shows a cross section taken along line VII-VII of a switching device having a trench 140 extending in a mesh shape (in this case, in a grid shape) as shown in FIG. 6. In FIG. 7, an upper electrode 150 is constituted of a first metal layer 151 and a second metal layer 152. When the first metal layer 151 is formed, recesses 151a are formed on a surface of the first metal layer 151 above contact holes 162a of an interlayer insulating film 162. Accordingly, the first metal layer 151 has a plurality of the recesses 151a on its upper surface. The second metal layer 152 is disposed on the first metal layer 151. Accordingly, the second metal layer 152 is filled in each recess 151a. Further, in a switching device as described in Japanese Patent Application Publication No. 2015-225872, as shown in FIG. 7, an upper surface in an outer peripheral portion of a semiconductor substrate 118 is usually covered with an insulating protective film 160. The insulating protective film 160 is provided to cover an outer peripheral side portion of the first metal layer 151 such that no gap is generated between the first metal layer 151 and the insulating protective film 160. The insulating protective film 160 has an opening 180. The second metal layer 152 covers the first metal layer 151 in the opening 180. Further, the second metal layer 152 is provided to make contact with an inner peripheral side end 160a (a side surface of the opening 180) of the insulating protective film 160 such that no gap is generated between the second metal layer 152 and the insulating protective film 160. Notably, in FIG. 7, a portion of the second metal layer 152 is disposed above the insulating protective film 160. Alternatively, the second metal layer 152 may not be disposed above the insulating protective film 160.

As the switching device in FIG. 7 operates, a temperature of the semiconductor substrate 118 rises. Then, temperatures of the first metal layer 151, the second metal layer 152 and the insulating protective film 160 also rise. A linear expansion coefficient of the second metal layer 152 is generally smaller than a linear expansion coefficient of the first metal layer 151. Further, a linear expansion coefficient of the insulating protective film 160 is generally equal to or larger than the linear expansion coefficient of the first metal layer 151. The first metal layer 151 thermally expands along with the second metal layer 152 in a range where the first metal layer 151 is in contact with the second metal layer 152. Since the linear expansion coefficient of the second metal layer 152 is small, thermal expansion of the first metal layer 151 is suppressed in the range. Especially since the second metal layer 152 is filled in each recess 151a in the upper surface of the first metal layer 151, the first metal layer 151 is firmly restrained by the second metal layer 152. Due to this, thermal expansion amount of the first metal layer 151 is small in the range where the first metal layer 151 is in contact with the second metal layer 152. On the other hand, the first metal layer 151 thermally expands along with the insulating protective film 160 in a range where the first metal layer 151 is in contact with the insulating protective film 160. Since the linear expansion coefficient of the insulating protective film 160 is relatively large, the thermal expansion amount of the first metal layer 151 is relatively large in this range. The first metal layer 151 directly below the inner peripheral side surface 160a of the insulating protective film 160 is positioned at a boundary between a range having a small thermal expansion amount (the range where the first metal layer 151 is in contact with the second metal layer 152) and a range having a large thermal expansion amount (the range where the first metal layer 151 is in contact with the insulating protective film 160). Due to this, when the temperature of the switching device changes, stress is likely to concentrate on the first metal layer 151 directly below the side surface 160a, and cracks are thus liable to occur in the first metal layer 151 in this portion.

Figure 8:
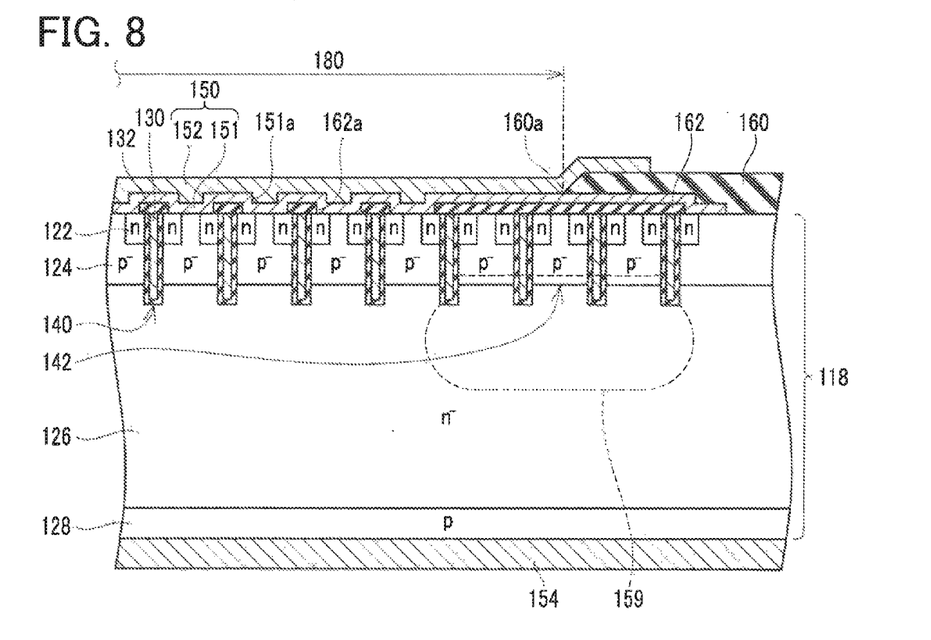
FIG. 8 is a vertical cross sectional view of a switching device of comparative example 2.

Contrary to this, as shown in FIG. 8, it is conceivable that an entirety of an upper surface of each cell region 142 (a region surrounded by the trench 140) is covered with the interlayer insulating film 162 in a vicinity of the inner peripheral side surface 160a of the insulating protective film 160 (that is, no contact holes 162a are provided in the interlayer insulating film 162 in the vicinity of the side surface 160a). An upper surface of the interlayer insulating film 162 becomes flat in a range where no contact holes 162a are provided. Due to this, the upper surface of the first metal layer 151 also becomes flat on the interlayer insulating film 162 in this range. That is, the recesses 151a are not present in the upper surface of the first metal layer 151 in this range. Accordingly, in this range, the first metal layer 151 is in contact with the second metal layer 152 at a flat surface. The restraining force of the second metal layer 152 upon the first metal layer 151 is weak at the flat surface. Due to this, the thermal expansion amount of the first metal layer 151 in the flat surface range is large compared to the thermal expansion amount of the first metal layer 151 in a range where the recesses 151a are present (it should be noted that the thermal expansion amount of the first metal layer 151 even in this flat surface range is small compared to the thermal expansion amount of the first metal layer 151 in a range where the first metal layer 151 is in contact with the insulating protective film 160). As a result of this, a difference in thermal expansion amount of the first metal layer 151 between a range where the thermal expansion amount of the first metal layer 151 is small (range where the first metal layer 151 is in contact with the second metal layer 152) and a range where the thermal expansion amount of the first metal layer 151 is large (range where the first metal layer 151 is in contact with the insulating protective film 160) becomes small at a position directly below the side surface 160a of the insulating protective film 160. Due to this, this configuration reduces the thermal stress generated in the first metal layer 151 at the position directly below the side surface 160a, and suppresses the occurrence of the cracks in the first metal layer 151 at this portion.

However, according to the configuration of FIG. 8, there occurs a problem that a resistance of the second region 126 increases upon when the switching device turns on. The details will be explained hereinbelow. In FIG. 8, in each cell region 142 below the interlayer insulating film 162 in a range where no contact holes 162a are present, the body region 124 is not connected to the upper electrode 150, and thereby a potential of the body region 124 is floating. Upon when the switching device turns off, a difference in potential between the second region 126 and the body region 124 becomes large. Then, a depletion layer extends from a pn junction at an interface between the second region 126 and the body region 124 to its surroundings. This depletion layer depletes the second region 126 in a wide range. Further, this depletion layer partially depletes the body region 124 as well. When the depletion layer expands in the body region 124, a part of charges in the body region 124 (e.g., holes) is reunited with charges in the second region 126 (e.g., electrons) to disappear. Accordingly, as the depletion layer expands, the charges in the body region 124 reduce.

After that, when the potential of the gate electrode 130 is controlled to a gate-on potential, channel is formed in the body region 124 in a range adjacent to a gate insulating film 132. Then the potential of the second region 126 becomes substantially equal to a potential of first regions 122. Charges are then supplied from the upper electrode 150 to the body region 124 in a range where the body region 124 is connected to the upper electrode 150. Due to this, the depletion layer extending from the pn junction at the interface between the body region 124 and the second region 126 disappears. Accordingly, a current flows between an electrode 154 and the upper electrode 150.

Contrary to this, charges are not supplied from the upper electrode 150 to the body region 124 in the range where the body region 124 is floating (the region where no contact holes 162a are present). Due to this, even when the channel is formed, a state where the depletion layer extends in the second region 126 below the floating body region 124 is maintained. That is, even in an ON-state, as shown in FIG. 8, a depletion layer 159 expands from the floating body region 124 into the second region 126. Due to this, in this switching device a current path in the second region 126 is narrow and a resistance of the second region 126 is high in the ON-state. As such, the resistance of the second region 126 is high when the switching device turns on in this switching device.

Notably, in FIGS. 6 to 8, the switching device including a collector region 128 (i.e., IGBT: Insulated Gate Bipolar Transistor) is described as an example. However, a similar problem may occur in a case of a FET (Field Effect Transistor), which does not include the collector region 128. The above-described problem may occur both in an n-channel type FET and a p-channel type FET. Further, in FIGS. 7 and 8, the electrode 154 is provided on a lower surface of the semiconductor substrate 118. However, the electrode 154 may be provided in other positions.

In FIG. 8, the problem of the floating body region 124 can be solved if the trench 140 is removed from below a portion of the interlayer insulating film 162 where the contact holes 162a are not present. However, if the trench 140 is locally removed, there may occur a problem that electric field concentrates in a periphery of a portion of the trench 140 which is adjacent to the region from which the trench 140 is locally removed, thereby decreasing the breakdown voltage of the switching device.

The present disclosure provides a technique that can suppress occurrence of cracks in a first metal layer below a side surface of an opening of an insulating protective layer, can ensure breakdown voltage of a switching device, and can reduce resistance of a second region when the switching device turns on.

A switching device disclosed herein comprises a semiconductor substrate; a gate insulating film; a gate electrode; an interlayer insulating film; a first metal layer; a second metal layer, and an insulating protective film. A trench extending in a mesh-shape is provided in an upper surface of the semiconductor substrate. The gate insulating film covers an inner surface of the trench. The gate electrode is disposed inside the trench and is insulated from the semiconductor substrate by the gate insulating film. Each region of the semiconductor substrate surrounded by the trench in a plan view of the upper surface is termed as a cell region. A range including a plurality of the cell regions in the plan view of the upper surface is termed as a first element range. A range surrounding a periphery of the first element range in the plan view of the upper surface and including a plurality of the cell regions is termed as a surrounding range. The interlayer insulating film covers the upper surface and the gate electrode in a range across the first element range and the surrounding range. Within the first element range a contact hole is provided in the interlayer insulating film above each of the cell regions. Within the surrounding range the interlayer insulating film covers an entirety of the upper surface above the cell regions. The first metal layer covers the interlayer insulating film, is insulated from the gate electrode by the interlayer insulating film, and is in contact with the upper surface within the contact hole. A recess is provided on a surface of the first metal layer above the contact hole. The insulating protective film covers an outer peripheral side portion of the first metal layer in the surrounding range. An opening is provided in the insulating protective film in a range wider than the first element range and including the first element range. The second metal layer is in contact with the surface of the first metal layer in the opening, is in contact with a side surface of the opening, and has a linear expansion coefficient smaller than a linear expansion coefficient of the first metal layer. Each of the cell regions within the first element range comprises: a first region of a first conductivity type which is in contact with the first metal layer and the gate insulating film; and a body region of a second conductivity type which is in contact with the first metal layer and is in contact with the gate insulating film below the first region. Each cell region within the surrounding range comprises a second conductivity type peripheral region of the second conductivity type which extends to below a lower end of the trench within the surrounding range and is electrically connected to the body region. The semiconductor substrate comprises a second region of the first conductivity type that is disposed across below the body region and below the second conductivity type peripheral region, is in contact with the gate insulating film below the body region, and is separated from the first regions by the body region.

It should be noted that "outer peripheral side" herein means a farther side from the first element range, and "inner peripheral side" herein means a closer side to the first element range.

In this switching device, entireties of the upper surfaces of the cell regions in the surrounding range are covered with the interlayer insulating film. That is, no contact hole is provided in the interlayer insulating film within the surrounding range. Thus, the upper surface of the interlayer insulating film in the surrounding range is flat. Due to this, the surface of the first metal layer on the interlayer insulating film is also flat in the surrounding range. In this switching device, the side surface of the opening of the insulating protective film (the inner peripheral side end of the insulating protective film) is positioned in the surrounding range (i.e., range where the upper surface of the first metal layer is flat). Further, the second metal layer that covers the upper surface of the first metal layer in the first element range is in contact with the side surface of the opening of the insulating protective film. That is, in this switching device the side surface of the opening of the insulating protective film (i.e., boundary between a range where the first metal layer is in contact with the second metal layer and a range where the first metal layer is in contact with the insulating protective film) is positioned within the surrounding range where the upper surface of the first metal layer is flat. Due to this, similarly to the case of FIG. 8, thermal stress applied to the first metal layer at the position directly below the side surface of the opening of the insulting protective film is mitigated. Thus, in this switching device, cracks are less likely to occur in the first metal layer at the position directly below the side surface of the opening of the insulating protective film.

Further, in this switching device, the second conductivity type peripheral region is provided in the semiconductor substrate in the surrounding range. The second conductivity type peripheral region extends from within each cell region to below the trench within the surrounding range, and is connected to the body regions. That is, a potential of each cell region below the interlayer insulating film having no contact holes is not floating, but is connected to the potential of the body region (i.e., a potential of the first metal layer). Upon when turning off the switching device, a depletion layer extends from a pn junction at an interface between the second conductivity type peripheral region and the second region. At this occasion, charges in the second conductivity type peripheral region decrease. Upon when turning on the switching device, charges are supplied to the second conductivity type peripheral region via the body region. Due to this, when the switching device turns on, the depletion layer that had extended from the pn junction at the interface between the second conductivity type peripheral region and the second region disappears. Accordingly, current become able to flow through the second region in a wide range. Due to this, when the switching device turns on, the resistance of the second region is low.

Further, as described above, by providing the second conductivity type peripheral region that extends to a position below the trench within the surrounding range, the electric field in the peripheries of the portions of the trench adjacent to the second conductivity type peripheral region can be mitigated. Accordingly, the breakdown voltage of the switching device can be ensured.

As described above, according to the switching device disclosed herein, occurrence of cracks in the first metal layer directly below the side surface of the opening of the insulating protective film can be suppressed. Further, according to this switching device, the breakdown voltage of the switching device can be maintained since the electric field concentration in the peripheries of the trench portions adjacent to the second conductivity type peripheral region is mitigated. In addition, according to this switching device, the resistance of the second region upon when turning on the switching device can be reduced.

DETAILED DESCRIPTION

Figure 1:
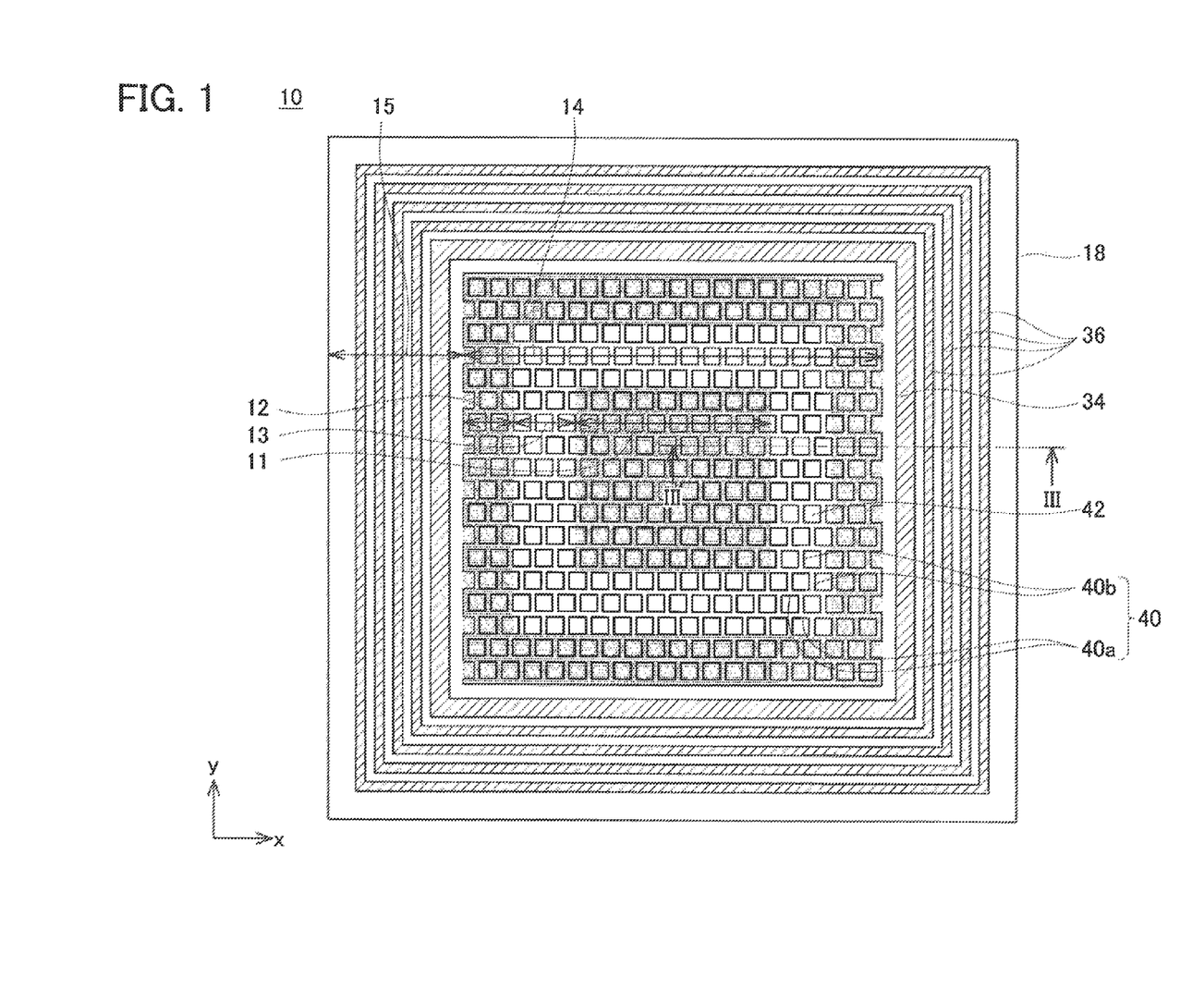
FIG. 1 is a plan view of an IGBT 10 of an embodiment.
Figure 2:
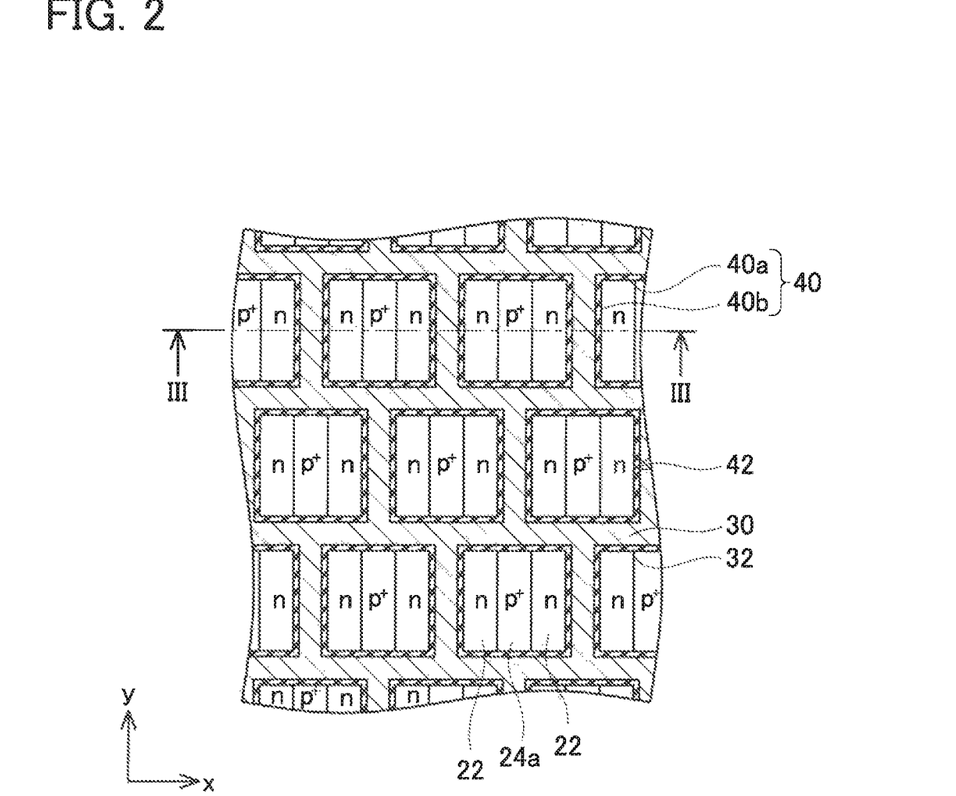
FIG. 2 is an enlarged view of an upper surface 18a of a semiconductor substrate 18.
Figure 3:
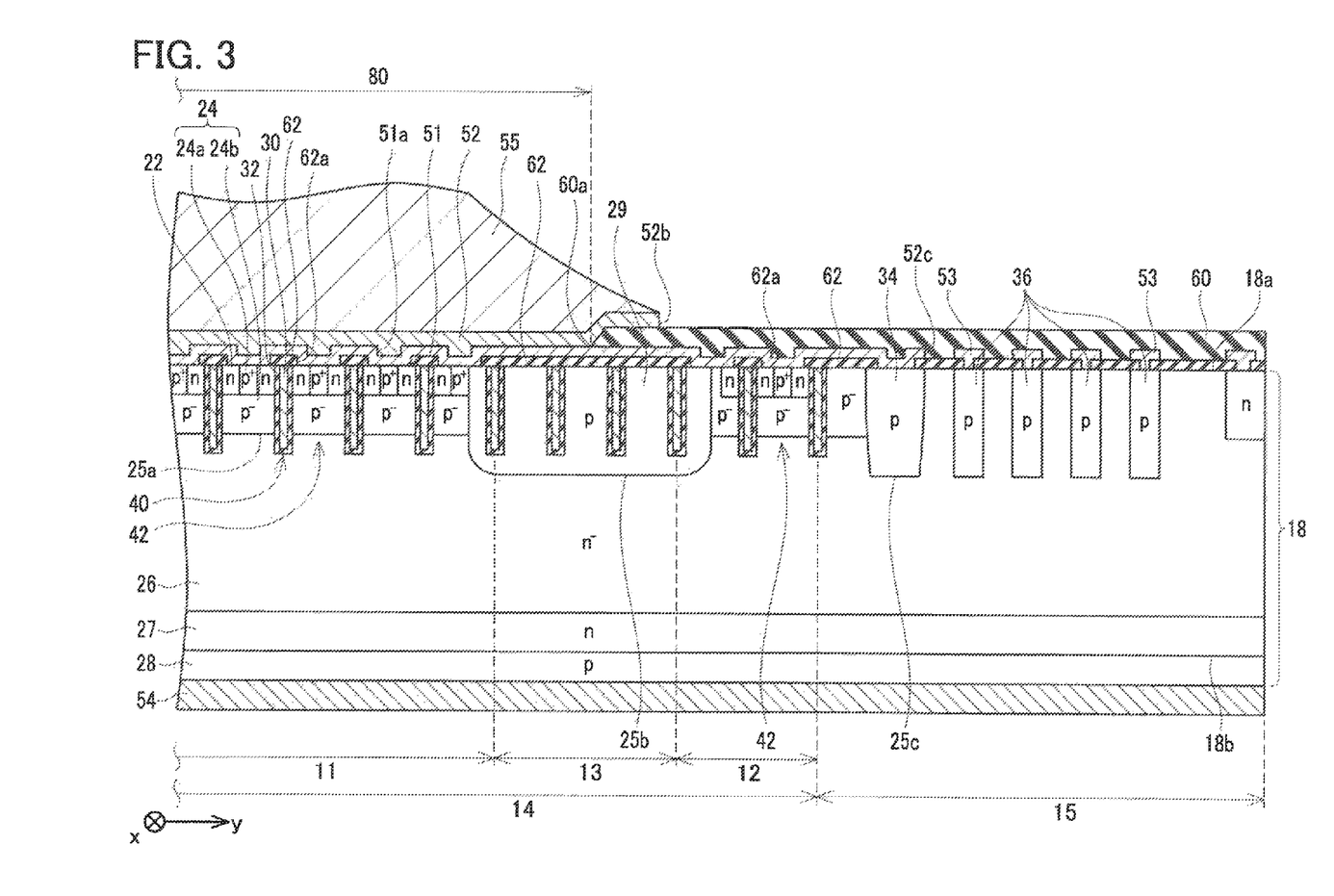
FIG. 3 is a vertical cross sectional view of the IGBT 10 (vertical cross sectional view taken along line of III-III of FIGS. 1 and 2).

An IGBT 10 of an embodiment shown in FIGS. 1 to 3, comprises a semiconductor substrate 18, electrodes each provided at an upper surface 18a and a lower surface 18b of the semiconductor substrate 18, and an insulating film. Notably, in FIGS. 1 and 2, illustration of the electrode on the upper surface 18a of the semiconductor substrate 18 and the insulating film is omitted for easier explanation. Further, a direction parallel to the upper surface 18a of the semiconductor substrate 18 will be denoted an X direction and a direction parallel to the upper surface 18a and perpendicular to the X direction will be denoted a Y direction, hereinbelow.

As shown in FIG. 1, a trench 40 is provided in the upper surface 18a of the semiconductor substrate 18. The trench 40 comprises a plurality of first trenches 40a that extends parallel to the X direction, and a plurality of second trenches 40b that extends parallel to the Y direction. The first trenches 40a are arranged with intervals from each other along the Y direction. A plurality of second trenches 40b is arranged in each of the intervals between two adjacent first trenches 40a. Each pair of adjacent first trenches 40a is connected by the corresponding second trenches 40b. The second trenches 40b are arranged such that each pair of second trenches adjacent in the y direction is not directly connected. The upper surface 18a of the semiconductor substrate 18 is partitioned into a multitude of rectangular regions by the trench 40 (i.e., first trenches 40a and the second trenches 40b). That is, the trench 40 extends in a mesh shape such that the multitude of rectangular regions is defined. Each of the rectangular semiconductor regions surrounded by the trench 40 will be hereinafter referred to as a cell region 42. Further, a range where the trench 40 is provided in a plan view of the upper surface 18a of the semiconductor substrate 18, will be hereinafter referred to as a trench range 14. Further, in the trench range 14, a range positioned at a center of the semiconductor substrate 18 will be hereinafter referred to as a first element range 11. The first element range 11 includes a plurality of the cell regions 42. Further, in the trench range 14, an annular range adjacent to the first element range 11 and surrounds the first element range 11, will be hereinafter referred to as a surrounding range 13. The surrounding range 13 includes a plurality of the cell regions 42 adjacent to the first element range 11. Further, in the trench range 14, an annular range adjacent to the surrounding range 13 and surrounds the surrounding range 13, will be hereinafter referred to as a second element range 12. The second element range 12 includes a plurality of the cell regions 42 adjacent to the surrounding range 13. In FIG. 1, the first element range 11 and the second element range 12 are shown by shading. A range between the first element range 11 and the second element range 12 corresponds to the surrounding range 13. A cell structure for performing switching is provided in the first element range 11 and the second element range 12. Further, a range positioned on an outer peripheral side than the trench range 14 (side closer to an outer peripheral end surface of the semiconductor substrate 18) will be hereinafter referred to as an outer peripheral voltage resistant range 15.

As show in FIGS. 2 and 3, an inner surface of the trench 40 is covered with a gate insulating film 32. Further, a gate electrode 30 is disposed inside the trench 40. The electrode 30 extends in a mesh shape corresponding to the trench 40 in the plan view of the upper surface 18a of the semiconductor substrate 18. The gate electrode 30 is insulated from the semiconductor substrate 18 by the gate insulating film 32.

As shown in FIGS. 2, 3, each cell region 42 in the first element range 11 includes emitter regions 22 and a body region 24.

Each emitter region 22 is an n-type region. Two emitter regions 22 are provided in each cell region 42 in the first element range 11. Each emitter region 22 is disposed in a range exposed on the upper surface 18a of the semiconductor substrate 18. The emitter regions 22 are in contact with the gate insulating film 32 at an uppermost portion of the trench 40.

The body region 24 is a p-type region. The body region 24 is exposed on the upper surface 18a of the semiconductor substrate 18 between the two emitter regions 22. The body region 24 extends from the position exposed on the upper surface 18a to a position below the emitter regions 22. The body region 24 includes high density regions 24a and a low density region 24b that has a lower p-type impurity density than the high density regions 24a. Each high density region 24a is disposed in a range exposed on the upper surface 18a. The low density region 24b is disposed below the emitter regions 22. The low density region 24b is in contact with the gate insulating film 32 at below the emitter regions 22.

Each cell region 42 in the second element range 12 also includes emitter regions 22 and the body region 24. The emitter regions 22 and the body region 24 in the second element range 12 have the same configurations as those of the emitter regions 22 and the body region 24 in the first element range 11 respectively.

As shown in FIG. 3, a p-type peripheral region 29 is provided in the surrounding range 13. The p-type peripheral region 29 is provided in ranges exposed on the upper surface 18a of the semiconductor substrate 18 in the surrounding range 13. The p-type peripheral region 29 extends in an annular shape so as to surround the first element range 11 in a plan view of the semiconductor substrate 18 from above. The p-type peripheral region 29 extends across entire ranges of the cell regions 42 within the surrounding range 13, and extends from the respective cell regions 42 to a region below the trench 40 within the surrounding range 13. Portions of the p-type peripheral region 29 in the respective cell regions 42 are connected to each other via a region below the trench 40. Further, a part of the p-type peripheral region 29 extends over into the first element range 11 and the second element range 12. The p-type peripheral region 29 is connected to the body region 24 in the first element range 11 and also to the body region 24 in the second element range 12.

As shown in FIGS. 1 and 3, a terminal region 34 and a plurality of guard rings 36 are provided in the outer peripheral voltage resistant range 15.

The terminal region 34 is positioned in a range exposed on the upper surface 18a of the semiconductor substrate 18. The terminal region 34 extends from the upper surface 18a to a lower side than the lower end of the trench 40. The terminal region 34 extends in an annular shape to surround the trench range 14. The terminal region 34 is in contact with the body region 24.

Each guard ring 36 is positioned in a range exposed on the upper surface 18a of the semiconductor substrate 18. Each guard ring 36 extends from the upper surface 18a to the lower side than the lower end of the trench 40. The terminal range 34 is surrounded by the multiple guard rings 36. Each guard ring 36 is separated from the body regions 24 and the terminal region 34. Further, the respective guard rings 36 are separated from each other.

As shown in FIG. 3, the semiconductor substrate 18 includes a drift region 26, a buffer region 27, and a collector region 28.

The drift region 26 is an n-type region having a low n-type impurity density. The drift region 26 extends across the first element range 11, the surrounding range 13, the second element range 12, and the outer peripheral voltage resistant range 15. Within the first element range, the drift region 26 is disposed below the body region 24 and is in contact with the body region 24 from below the body region 24. Within the first element range 11, the drift region 26 is separated from the emitter regions 22 by the body region 24. Within the first element range 11, the drift region 26 is in contact with the gate insulating film 32 below the body region 24. Within the surrounding range 13, the drift region 26 is disposed below the p-type peripheral region 29 and is in contact with the p-type peripheral region 29 from below the p-type peripheral region 29. Within the second element range 12 the drift region 26 is disposed below the body region 24, and is in contact with the body region 24 from below the body region 24. Within the second element range 12, the drift region 26 is separated from the emitter regions 22 by the body region 24. Within the second element range 12, the drift region 26 is in contact with the gate insulating film 32 below the body region 24. Within the outer peripheral voltage resistant range 15, the drift region 26 is in contact with the terminal region 34 and the respective guard rings 36. The terminal region 34 is separated from the guard rings 36 by the drift region 26. Further, the respective guard rings 36 are separated from each other by the drift region 26.

The buffer region 27 is an n-type region having a higher n-type impurity density than the drift region 26. The buffer region 27 extends across the first element range 11, the surrounding range 13, the second element range 12, and the outer peripheral voltage resistant range 15. The buffer region 27 is disposed below the drift region 26, and is in contact with the drift region 26 from below the drift region 26.

The collector region 28 is a p-type region. The collector region 28 extends across the first element range 11, the surrounding range 13, the second element range 12, and the outer peripheral voltage resistant range 15. The collector region 28 is disposed below the buffer region 27, and is in contact with the buffer region 27 from below the buffer region 27. The collector region 28 is exposed on the lower surface 18b of the semiconductor substrate 18.

As shown in FIG. 3, an interlayer insulating film 62, an ohmic metal layer 51, a plurality of ring electrodes 53, an insulating protective film 60, and a surface metal layer 52 are arranged in the semiconductor substrate 18.

The interlayer insulating film 62 is disposed on the upper surface 18a of the semiconductor substrate 18. The interlayer insulating film 62 extends across the trench range 14 and the outer peripheral voltage resistant range 15. An entirety of an upper surface of the gate electrode 30 is covered with the interlayer insulating film 62. A contact hole 62a piercing the interlayer insulating film 62 in a vertical direction is provided above each of the cell regions 42 within the first element range 11 and the second element range 12. No contact holes are provided above the respective cell regions 42 within the surrounding range 13. That is, entireties of the upper surfaces of the respective cell regions 42 within the surrounding range 13 are covered with the interlayer insulating film 62. Contact holes are provided in the interlayer insulating film 62 within the outer peripheral voltage resistant range 15 above the terminal region 34 and above the respective guard rings 36 and the like.

The ohmic metal layer 51 covers the interlayer insulating film 62 in the first element range 11, the surrounding range 13, and the second element range 12. The ohmic metal layer 51 extends along a surface of the interlayer insulating film 62 and the upper surface 18a of the semiconductor substrate 18, and has a substantially constant thickness. Thus, an upper surface of the ohmic metal layer 51 is recessed following the contact holes 62a within the first element range 11 and the second element range 12. That is, recesses 51a are provided on the surface of the ohmic metal layer 51 above the respective contact holes 62a. The ohmic metal layer 51 is in contact with the upper surface 18a of the semiconductor substrate 18 in each contact hole 62a. The ohmic metal layer 51 is in ohmic contact with the emitter regions 22 and the high density region 24a of the body region 24 in each contact hole 62a. Since the contact holes 62a are not provided in the interlayer insulating film 62 in the surrounding range 13, the upper surface of the ohmic metal layer 51 is flat in the surrounding range 13. Further, a part of the ohmic metal layer 51 extends up to above the terminal region 34. The ohmic metal layer 51 is in ohmic contact with the terminal region 34 in the contact hole above the terminal region 34. The ohmic metal layer 51 is constituted of AlSi (alloy of aluminum and silicon).

A plurality of ring-electrodes 53 is disposed on the respective guard rings 36. The ring-electrodes 53 extend in an annular shape along the guard rings 36. Each ring-electrode 53 is in ohmic contact with the corresponding guard ring 36 within the contact hole above the guard ring 36.

The insulating protective film 60 is disposed above the ohmic metal layer 51, the interlayer insulating film 62 and the ring-electrodes 53 within the second element range 12 and within the outer peripheral voltage resistant range 15. Entire surfaces of the second element range 12 and the outer peripheral voltage resistant range 15 are covered with the insulating protective film 60. A part of the insulating protective film 60 extends over to the surrounding range 13. Within the surrounding range 13 the insulating protective film 60 is disposed on the ohmic metal layer 51. The insulating protective film 60 covers an outer peripheral portion of the ohmic metal layer 51 within the surrounding range 13. The insulating protective film 60 has an opening 80 at a center of the upper surface 18a of the semiconductor substrate 18. The opening 80 is provided in a range broader than the first element range 11 that includes the first element range 11. That is, the entirety of the first element range 11 and an inner peripheral portion of the surrounding range 13 are positioned within the opening 80. An inner peripheral side end 60a of the insulating protective film 60 (i.e., a side surface of the opening 80) is positioned within the surrounding range 13. The insulating protective film 60 is constituted of resin (e.g., polyimide). A linear expansion coefficient of the insulating protective film 60 is slightly greater than a linear expansion coefficient of the ohmic metal layer 51 (i.e., AlSi).

The surface metal layer 52 covers the surface of the ohmic metal layer 51 in a range not covered with the insulating protective film 60 (i.e., an inner peripheral portion of the ohmic metal layer 51 within the surrounding range 13, and the ohmic metal layer 51 in the first element range 11). The surface metal layer 52 is filled in each recess 51a within the first element range 11. A part of the surface metal layer 52 on the outer peripheral side extends to above the insulating protective film 60. Thus, the surface metal layer 52 is in contact with the insulating protective film 60 at the inner peripheral side surface 60a of the insulating protective film 60 (i.e., side surface of the opening 80). The surface metal layer 52 is constituted of Nickel. The surface metal layer 52 (i.e., Nickel) has a high solder wettability. The linear expansion coefficient of the surface metal layer 52 (i.e., Nickel) is smaller than the linear expansion coefficient of the ohmic metal layer 51 (i.e., AlSi). A soldering layer 55 is bonded to the surface metal layer 52. The surface metal layer 52 is connected by the soldering layer 55 to a metal block not shown.

A lower electrode 54 is disposed in the lower surface 18b of the semiconductor substrate 18. The lower electrode 54 is in ohmic contact with the collector region 28.

Next, operation of the IGBT 10 will be described. The IGBT 10 is used in a state where a voltage that makes the lower electrode 54 have a higher potential is applied between the ohmic metal layer 51 and the lower electrode 54. When a potential higher than a threshold voltage is applied to the gate electrode 30, channels are formed in the body regions 24 in ranges adjacent to the gate insulating film 32. The channels connect the emitter regions 22 and the drift region 26. Accordingly, electrons flow from the ohmic metal layer 51 to the lower electrode 54 through the emitter regions 22, the channels, the drift region 26, the buffer region 27, and the collector region 28. Further, holes flow from the lower electrode 54 to the ohmic metal layer 51 through the collector region 28, the buffer region 27, the drift region 26, and body regions 24. That is, the IGBT 10 turns on and current flows from the lower electrode 54 to the ohmic metal layer 51.

When the potential of the gate electrode 30 is decreased to a lower potential than the threshold voltage, the channels disappear. Then, a reverse voltage is applied to pn junctions 25*a* at interfaces between the body regions 24 and the drift region 26. Due to this, depletion layers extend from the pn junctions 25*a* to the body regions 24 and the drift region 26. Since the n-type impurity density of the drift region 26 is extremely low, the drift region 26 is depleted in a wide range. Further, when the depletion layers spread in the body regions 24, holes existing in the depleted range are reunited with electrons in the drift region 26 to disappear. Thus, as the depletion layers spread, the holes existing in the body regions 24 decrease.

Further, within the surrounding range 13, the reverse voltage is applied to a pn junction 25*b* of an interface between the p-type peripheral region 29 and the drift region 26. Due to this, a depletion layer extends from the pn junction 25*b* to the p-type peripheral region 29 and the drift region 26. The drift region 26 is depleted by the depletion layer extending from the pn junction 25*b* as well. Further, as the depletion layer extends to the p-type peripheral region 29, holes that exist in the depleted region are reunited with electrons in the drift region 26 to disappear. Thus, as the depletion layer spreads, the holes that exist in the p-type peripheral region 29 decrease.

Further, within the outer peripheral voltage resistant region 15, the reverse voltage is applied to a pn junction 25*c* at an interface between the terminal region 34 and the drift region 26. Due to this, a depletion layer extends from the pn junction 25*c* to the terminal region 34 and the drift region 26. When the depletion layer extending from the pn junction 25*c* to the drift region 26 reaches a first guard ring 36, which is positioned on the innermost peripheral side, the depletion layer extends from the first guard ring 36 to the drift region 26 around that first guard ring 36. When the depletion layer extending from the first guard ring 36 to the drift region 26 reaches a second guard ring 36, which is positioned next to the first guard ring 36, then the depletion layer extends from the second guard ring 36 to the drift region around that second guard ring 36. As such, within the outer peripheral voltage resistant region 15, the depletion layer extends to the outer peripheral side via the plurality of guard rings 36. Due to this, within the outer peripheral voltage resistant region 15, the drift region 26 is depleted over to a vicinity of the outer peripheral end surface 18*c* of the semiconductor substrate 18.

As explained above, if the potential of the gate electrode 30 is lowered to a potential lower than the threshold voltage, the channels disappear, thereby depleting the drift region 26 in a wide range. The body regions 24 are separated from the buffer region 27 by the depletion layers. Due to this, when the potential of the gate electrode 30 is lowered to a potential lower than the threshold voltage, the current flowing in the IGBT 10 is stopped. That is, the IGBT 10 is turned off.

Figure 4:
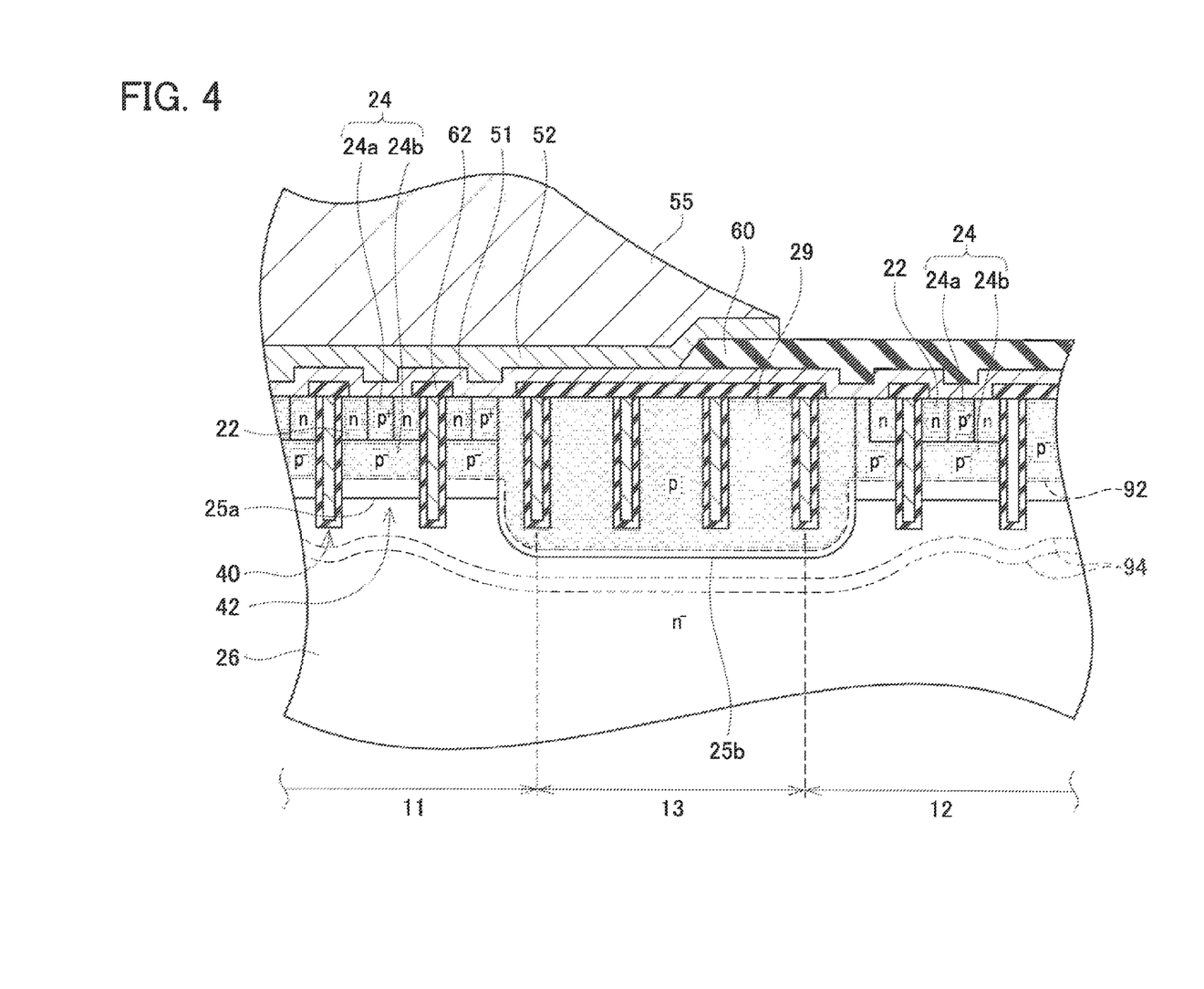
FIG. 4 is an enlarged cross sectional view around a p-type peripheral region 29.

FIG. 4 shows a distribution of the depletion layer around the p-type peripheral region 29 in a state where the IGBT 10 is off. In FIG. 4, a broken line 92 shows an upper end of the depletion layer. In FIG. 4, a semiconductor region above the broken line 92 (shaded region) is a semiconductor region that is not depleted (hereinafter referred to as an undepleted region), and a semiconductor region below the broken line 92 is a semiconductor region that is depleted. Further as shown in FIG. 4, the drift region 26 is depleted in an entire range shown in FIG. 4. Further, although the p-type peripheral region 29 and the body regions 24 are partially depleted in vicinities of the lower ends thereof, most of the p-type peripheral region 29 and the body regions 24 are not depleted. Since the p-type impurity density of the p-type peripheral region 29 is higher than the p-type impurity density of the low density regions 24*b* of the body regions 24, the depletion layer is less likely to extend in the p-type peripheral region 29 than in the low density regions 24*b*. Thus, a width of the depletion layer in the p-type peripheral region 29 becomes narrower than a width of the depletion layer in the body regions 24. Further, broken lines 94 in FIG. 4 are equipotential lines indicating a potential distribution in the depletion layer. Since the p-type peripheral region 29 extends to a position lower than the lower end of the trench 40, the equipotential lines 94 are distributed in a lower position in the surrounding range 13 than the equipotential lines 94 in the first element range 11 and the second element range 12. Thus, the electric field is mitigated around the lower end of a portion of the trench 40 that is closest to the surrounding range 13. Thus, occurrence of the high electric field is suppressed in the vicinity of the p-type peripheral region 29.

When the IGBT 10 is again turned from the OFF state (state of FIG. 4) to a state where the potential of the gate electrode 30 is raised to a potential higher than its threshold voltage, channels are formed in the body regions 24 and the potential of the drift region 26 decreases. Then holes are supplied from the ohmic metal layer 51 to the body regions 24. Due to this, the depletion layers that had extended from the pn junctions 25*a* at the interfaces between the body regions 24 and the drift region 26 shrink and disappear. Due to this, electrons and holes become able to flow in the drift region 26, and thus the IGBT 10 is turned on.

Further, when the potential of the drift region 26 is decreased, holes are supplied from the ohmic metal layer 51 to the p-type peripheral region 29 via the body regions 24. Due to this, the depletion layer that had extended from the pn junction 25*b* at the interface between the p-type peripheral region 29 and the drift region 26 shrinks and disappears. Accordingly, electrons and holes become able to flow also in the drift region 26 below the p-type peripheral region 29. Due to this, a range in the drift region 26 where the electrons and the holes can flow becomes larger, the resistance of the drift region 26 decreases. Accordingly, a steady loss is not likely to be generated, and ON voltage is small in this IGBT 10.

It should be noted that in FIG. 4 if the upper end of the depletion layer in the p-type peripheral region 29 (i.e., the broken line 92) reaches the lower end of the trench 40, the undepleted regions in the p-type peripheral region 29 are separated from the body regions 24 by the depletion layer. Accordingly, since each of the undepleted regions in the p-type peripheral region 29 is floating, the holes are less likely to be supplied to the undepleted regions in the p-type peripheral region 29 when the IGBT 10 is turned on. Accordingly, when the IGBT 10 is turned on, the depletion layer that had extended from the pn junction 25*b* at the interface between the p-type peripheral region 29 and the drift region 26 hardly shrinks. At this occasion, despite the fact that the IGBT 10 is on, the depletion layer has extended in the drift region 26 below the p-type peripheral region 29, and thus electrons and holes become unable to flow in the drift region 26 below the p-type peripheral region 29. Accordingly, at this occasion, the resistance of the drift region 26 is high. Contrary to this, in the IGBT 10 of the embodiment, the p-type impurity density of the p-type peripheral region 29 is higher than the p-type impurity density of the low density regions 24b. Due to this, the depletion layer is less likely to spread into the p-type peripheral region 29. Due to this, the depletion layers are suppressed from reaching the lower end of the trench 40. Thus, it is possible in the IGBT 10 of the embodiment to eliminate the depletion layer from the below of the p-type peripheral region 29 when the IGBT 10 is turned on. Thus, the IGBT 10 of the embodiment can reliably operate at a low loss.

Further, by the IGBT 10 repeating to turn ON and OFF, the temperature of the semiconductor substrate 18 repeatedly changes. Due to this, the temperatures of the ohmic metal layer 51, the surface metal layer 52, and the insulating protective film 60 above the semiconductor substrate 18 repeatedly change as well.

The ohmic metal layer 51 thermally expands along with the surface metal layer 52 in the range where the ohmic metal layer 51 is in contact with the surface metal layer 52 (i.e., the first element range 11 and the inner peripheral portion of the surrounding range 13). As described above, the linear expansion coefficient of the surface metal layer 52 (i.e., Nickel) is smaller than the linear expansion coefficient of the ohmic metal layer 51 (i.e., AlSi). Due to this, the thermal expansion of the ohmic metal layer 51 is suppressed in this range. Since the surface metal layer 52 is filled in each recess 51a in the upper surface of the ohmic metal layer 51 in the first element range 11, the ohmic metal layer 51 is firmly restrained by the surface metal layer 52. Due to this, thermal expansion amount of the ohmic metal layer 51 in the first element range 11 is small. On the other hand, the recesses 51a are not provided in the upper surface of the ohmic metal layer 51 in the surrounding range 13 in the range where the ohmic metal layer 51 and the surface metal layer 52 are in contact with each other (i.e., the inner peripheral side of the surrounding range 13), and thus the upper surface of the ohmic metal layer 51 is flat. Due to this, restraint force of the surface metal layer 52 on the ohmic metal layer 51 on the inner peripheral side of the surrounding range 13 is small compared to the restraint force of the surface metal layer 52 on the ohmic metal layer 51 in the first element range 11. Accordingly, the thermal expansion amount of the ohmic metal layer 51 is larger in this range than the thermal expansion amount of the ohmic metal layer 51 in the first element range 11.

The ohmic metal layer 51 thermally expands along with the insulating protective film 60 in a range where the ohmic metal layer 51 is in contact with the insulating protective film 60 (i.e., the outer peripheral side of the surrounding range 13, the second element range 12, and the outer peripheral voltage resistant range 15). As described above, the linear expansion coefficient of the insulating protective film 60 (i.e., polyimide) is slightly larger than the linear expansion coefficient of the ohmic metal layer 51 (i.e., AlSi). Due to this, in this range the ohmic metal layer 51 has the largest thermal expansion amount within a range shown in FIG. 3.

As described above, in the IGBT 10 of the embodiment, the inner peripheral side surface 60a of the insulating protective film 60 (i.e., the side surface of the opening 80) is positioned in the surrounding range 13 (i.e., on the ohmic metal layer 51 having a flat upper surface). Due to this, a range of the ohmic metal layer 51 having a relatively large thermal expansion amount (i.e., the inner peripheral side of the surrounding range 13) is adjacent to a range of the ohmic metal layer 51 having the largest thermal expansion amount (i.e., the outer peripheral side of the surrounding range 13). Due to this, a difference in the thermal expansion amount of the ohmic metal layer 51 is not significantly large around the inner peripheral side surface 60a of the insulating protective film 60. Due to this, an extremely large stress is not likely to be generated in the ohmic metal layer 51 below the side surface 60a. Accordingly, occurrence of cracks in the ohmic metal layer 51 below the side surface 60a is suppressed. The IGBT 10 of the embodiment has a high reliability.

Notably, in the IGBT 10 of the embodiment, the surface metal layer 52 is formed by sputtering (hereinbelow referred to as a mask sputtering) through a stencil mask (mask plate prepared separately from the semiconductor substrate 18). Since high precision cannot be achieved by the mask sputtering, fluctuation in positions of an outer peripheral side end 52b of the surface metal layer 52 is large. If the outer peripheral side end 52b of the surface metal layer 52 extends toward the outer peripheral side than an outer peripheral side end 52c of the ohmic metal layer 51, a potential distribution in the drift region 26 in the outer peripheral voltage resistant range 15 is disturbed, and breakdown voltage of the IGBT 10 decreases. Further, if the outer peripheral side end 52b of the surface metal layer 52 is positioned on an inner peripheral side than the inner peripheral side end 60a of the insulating protective film 60, the ohmic metal layer 51 is exposed on a frontmost surface, leading to a lower reliability of the IGBT 10. Accordingly, a wide interval may preferably be provided between the outer peripheral side end 52c of the ohmic metal layer 51 and the inner peripheral side end 60a of the insulating protective film 60, and the outer peripheral side end 52b of the surface metal layer 52 may preferably be arranged in the wide interval. In this design, by providing the second element range 12 (i.e., range operating as a switching device) between the outer peripheral side end 52c of the ohmic metal layer 51 and the surrounding range 13, the semiconductor substrate 18 can be effectively utilized, and current capacity of the IGBT 10 can be increased.

Figure 5:
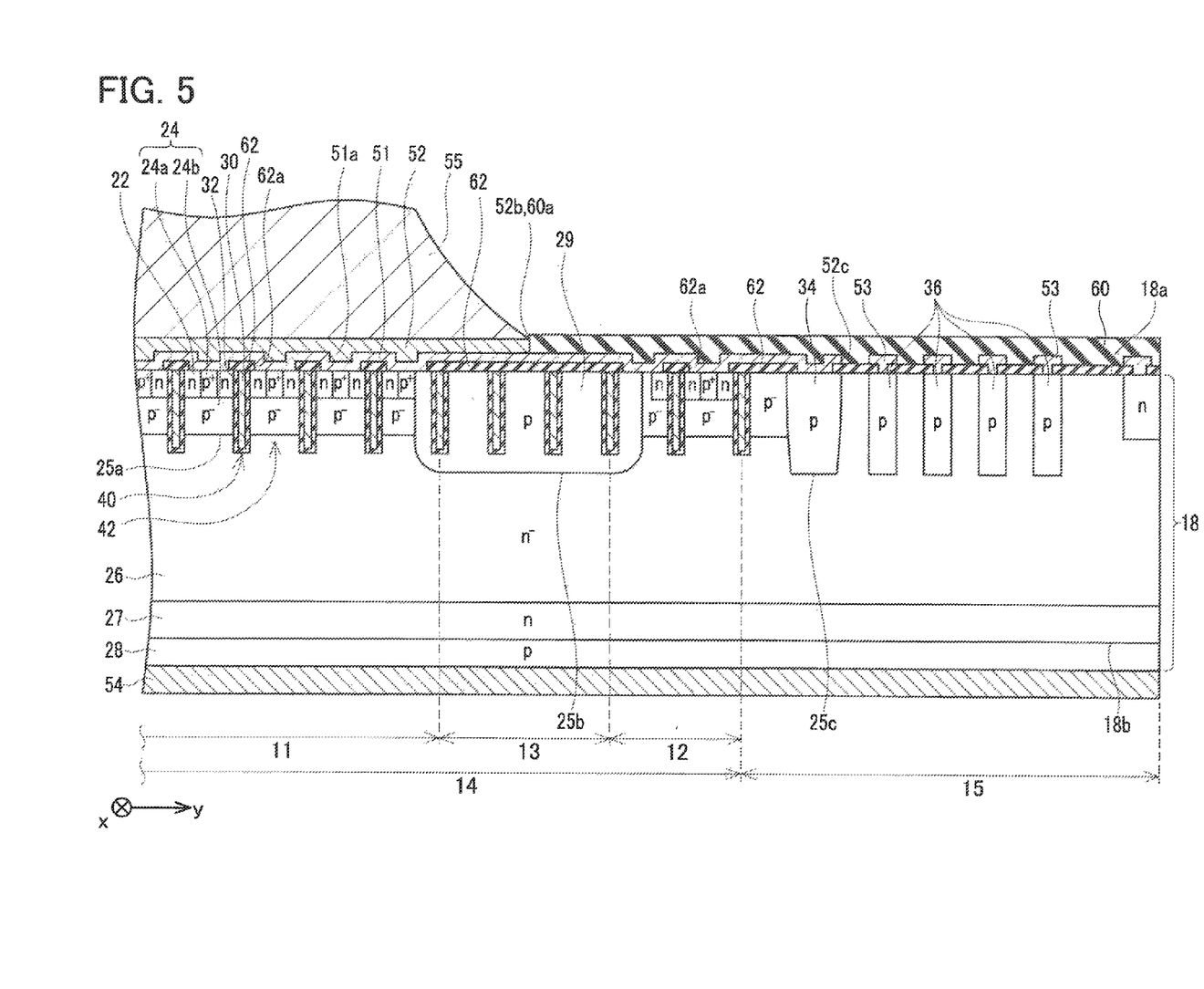
FIG. 5 is a vertical cross sectional view of an IGBT 10 of a variant.

Notably, in the above-described embodiment, the surface metal layer 52 is formed by mask sputtering. However, the surface metal layer 52 may be formed by plating. In this case, as shown in FIG. 5, the outer peripheral side end 52b of the surface metal layer 52 makes contact with the inner peripheral side end 60a of the insulating protective film 60 (i.e., side surface of the opening 80) without extending to above the insulating protective film 60. This configuration as well may bring the same advantageous effect as that in the above-described embodiment.

Further, in the above-described embodiment, the IGBT is explained. Alternatively, the technique disclosed herein may be applied to other switching devices including MOSFET. By providing an n-type region (drain region) which is in ohmic contact with the lower electrode 54, instead of the collector region 28 of the embodiments, an n-channel type MOSFET can be obtained. Further, a p-channel type MOSFET can be obtained by reversing the n-type regions and the p-type regions in the n-channel type MOSFET.

Further, in the above-described embodiment, the trench 40 extends such that each cell region 42 is formed in a rectangular shape. Alternatively, the trench 40 may extend such that each cell region 42 may be formed in a hexagonal shape. Further, the trench 40 may extend such that each cell region 42 may be formed in another shape.

Corresponding relationships of the constituent features of the semiconductor device of the above-described embodiment and the constituent features of the claims will be described. The ohmic metal layer 51 in the embodiment is one example of a first metal layer in the claims. The surface metal layer 52 of the embodiment is one example of a second metal layer in the claims. The emitter regions 22 of the embodiment are one example of a first region in the claims. The drift region 26 of the embodiment is one example of a second region in the claims. The p-type peripheral region 29 of the embodiment is one example of a second conductivity-type peripheral region in the claims.

Some technical elements disclosed herein will be listed. Notably, each of the following technical elements is useful independently.

In a configuration example of the present disclosure, a second-conductivity type impurity density of the second conductivity type peripheral region may be higher than a second-conductivity type impurity density of a portion of the body region positioned below the first regions.

When the switching device is turned off, the depletion layer extends in the second conductivity type peripheral region. When the depletion layer has reached the lower end of the trench, the portion of the p-type peripheral region 29 which is located above the lower end of the trench becomes floating, which is problematic. As described above, by having the second-conductivity type impurity density of the second-conductivity type peripheral region high, the depletion layer becomes less likely to extend within the second-conductivity type peripheral region. Due to this, the problem of floating can be prevented.

In a configuration example of the present disclosure, a guard ring may be provided outside of a range where the trench is provided. The guard ring may be exposed on the upper surface of the semiconductor substrate, may surround the range where the trench is provided, and may be electrically separated from the first metal layer.

According to this configuration, the breakdown voltage of the switching device can be further improved.

In a configuration example of the present disclosure, the switching device may comprise a second element range that surrounds a periphery of the surrounding range in the plan view of the upper surface and includes a plurality of the cell regions. Within the second element range, a contact hole may be provided in the interlayer insulation film above each of the cell regions. The first metal layer may be in contact with the upper surface in the contact hole within the second element range. The insulating protective film may cover the first metal layer in the second element range. The second metal layer is disposed across on the first metal layer in the opening and on the insulating protective film. An outer peripheral side end of the second metal layer may be positioned on an inner peripheral side relative to an outer peripheral side end of the first metal layer. Each of the cell regions in the second element range may include the first region and the body region.

For ensuring reliability of the switching device, an interval may be provided between the inner side end portion of the insulating protective film and the outer side end portion of the first metal layer, and an outer side end portion of the second metal layer may be preferably disposed in the interval. By providing the second element range (range functioning as the switching device) in this interval portion, current capacity of the switching device can be increased.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A switching device comprising: a semiconductor substrate; a gate insulating film; a gate electrode; an interlayer insulating film; a first metal layer; a second metal layer, and an insulating protective film,
   wherein,
   a trench extending in a mesh-shape is provided in an upper surface of the semiconductor substrate,
   the gate insulating film covers an inner surface of the trench,
   the gate electrode is disposed inside the trench, the gate electrode being insulated from the semiconductor substrate by the gate insulating film,
   when each region of the semiconductor substrate surrounded by the trench in a plan view of the upper surface is termed as a cell region, a range including a plurality of the cell regions in the plan view of the upper surface as a first element range, a range surrounding a periphery of the first element range in the plan view of the upper surface and including a plurality of the cell regions being termed as a surrounding range, the interlayer insulating film covering the upper surface and the gate electrode in a range across the first element range and the surrounding range,
   within the first element range, a contact hole is provided in the interlayer insulating film above each of the cell regions,
   within the surrounding range, the interlayer insulating film covers an entirety of the upper surface above the cell regions,
   the first metal layer covers the interlayer insulating film, being insulated from the gate electrode by the interlayer insulating film, being in contact with the upper surface within the contact hole,
   a recess is provided on a surface of the first metal layer above the contact hole,
   the insulating protective film covers an outer peripheral side portion of the first metal layer in the surrounding range,
   an opening is provided in the insulating protective film in a range wider than the first element range and including the first element range,
   the second metal layer is in contact with the surface of the first metal layer in the opening and is in contact with a side surface of the opening, the second metal layer having a linear expansion coefficient smaller than a linear expansion coefficient of the first metal layer,
   each of the cell regions within the first element range comprises:

a first region of a first conductivity type, being in contact with the first metal layer and the gate insulating film, and a body region of a second conductivity type, being in contact with the first metal layer and being in contact with the gate insulating film below the first region, each cell region within the surrounding range comprises a second conductivity type peripheral region of the second conductivity type, the second conductivity type peripheral region extending to below a lower end of the trench within the surrounding range and being electrically connected to the body region, and the semiconductor substrate comprises a second region of the first conductivity type, the second region being disposed across below the body region and below the second conductivity type peripheral region, being in contact with the gate insulating film below the body region, and being separated from the first regions by the body region.

2. The switching device of claim 1, wherein a second conductivity-type impurity density of the second conductivity-type peripheral region is higher than a second conductivity-type impurity density of a portion of the body region positioned below the first regions.

3. The switching device of claim 1, wherein a guard ring is provided outside of a range where the trench is provided, the guard ring being exposed on the upper surface, surrounding the range where the trench is provided, and being electrically separated from the first metal layer.

4. The switching device of claim 3, wherein the switching device comprises a second element range surrounding a periphery of the surrounding range in the plan view of the upper surface, the second element range including a plurality of the cell regions, within the second element range, a contact hole is provided in the interlayer insulation film above each of the cell regions, the first metal layer is in contact with the upper surface in the contact hole within the second element range, the insulating protective film covers the first metal layer within the second element range, the second metal layer is disposed across from on the first metal layer in the opening and to on the insulating protective film, an outer peripheral side end of the second metal layer is positioned on an inner peripheral side relative to an outer peripheral side end of the first metal layer, and each of the cell regions in the second element range includes the first region and the body region.

* * * * *